US010614996B2

(12) United States Patent
Yonezawa

(10) Patent No.: US 10,614,996 B2
(45) Date of Patent: Apr. 7, 2020

(54) X-RAY SYSTEM AND METHOD OF INSPECTING X-RAY TUBE

(71) Applicant: Canon Electron Tubes & Devices Co., Ltd., Otawara-shi (JP)

(72) Inventor: Tetsuya Yonezawa, Yaita (JP)

(73) Assignee: Canon Electron Tubes & Devices Co., Ltd., Otawara-shi (JP)

( * ) Notice: Subject to any disclaimer, the term of this patent is extended or adjusted under 35 U.S.C. 154(b) by 101 days.

(21) Appl. No.: 15/966,008

(22) Filed: Apr. 30, 2018

(65) Prior Publication Data

US 2018/0315579 A1 Nov. 1, 2018

(30) Foreign Application Priority Data

May 1, 2017 (JP) .................................. 2017-091327

(51) Int. Cl.
*H01J 37/244* (2006.01)
*H05G 1/26* (2006.01)
*H05G 1/34* (2006.01)
*H05G 1/54* (2006.01)
*H01J 37/24* (2006.01)

(52) U.S. Cl.
CPC .......... *H01J 37/243* (2013.01); *H01J 37/242* (2013.01); *H01J 37/244* (2013.01); *H05G 1/265* (2013.01); *H05G 1/34* (2013.01); *H05G 1/54* (2013.01)

(58) Field of Classification Search
CPC ...... H01J 37/242; H01J 37/243; H01J 37/244; H05G 1/265; H05G 1/34; H05G 1/54
See application file for complete search history.

(56) References Cited

U.S. PATENT DOCUMENTS

| 4,646,338 | A | * | 2/1987 | Skillicorn | ............... | H01J 35/04 378/110 |
| 5,077,773 | A | * | 12/1991 | Sammon | .................. | H05G 1/34 378/109 |
| 5,974,111 | A | * | 10/1999 | Krug | ...................... | G01N 23/20 378/53 |
| 6,449,337 | B1 | * | 9/2002 | Honda | ..................... | H05G 1/54 378/117 |
| 7,072,437 | B2 | * | 7/2006 | Seto | ........................ | A61B 6/032 378/162 |
| 7,924,981 | B2 | * | 4/2011 | Iijima | ...................... | H05G 1/12 378/110 |
| 2003/0076920 | A1 | * | 4/2003 | Shinno | .................. | A61B 6/032 378/4 |
| 2003/0081728 | A1 | * | 5/2003 | Nathan | ..................... | H05G 1/10 378/119 |
| 2005/0157849 | A1 | * | 7/2005 | Radley | .................. | A61B 6/586 378/207 |

(Continued)

FOREIGN PATENT DOCUMENTS

JP 4-229937 8/1992
JP 2012-238416 12/2012

*Primary Examiner* — Mark R Gaworecki
(74) *Attorney, Agent, or Firm* — Oblon, McClelland, Maier & Neustadt, L.L.P.

(57) ABSTRACT

According to one embodiment, an X-ray system includes an X-ray tube including a filament in which a filament current according to a tube current flows, a filament current monitoring unit monitoring the filament current, a tube current monitoring unit monitoring the tube current, and an inspection unit determining whether the tube current falls within a predetermined set range in X-ray emission.

3 Claims, 4 Drawing Sheets

(56) References Cited

U.S. PATENT DOCUMENTS

| | | | |
|---|---|---|---|
| 2005/0249329 A1* | 11/2005 | Kazama | A61B 6/032 378/16 |
| 2006/0008053 A1* | 1/2006 | Ishikawa | H05G 1/30 378/111 |
| 2015/0289352 A1* | 10/2015 | Honda | A61B 6/40 378/107 |
| 2016/0088718 A1* | 3/2016 | Jiang | H05G 1/32 378/110 |
| 2017/0118830 A1* | 4/2017 | Totsuka | H01J 35/06 |
| 2018/0082818 A1* | 3/2018 | Meiler | H01J 35/025 |

* cited by examiner

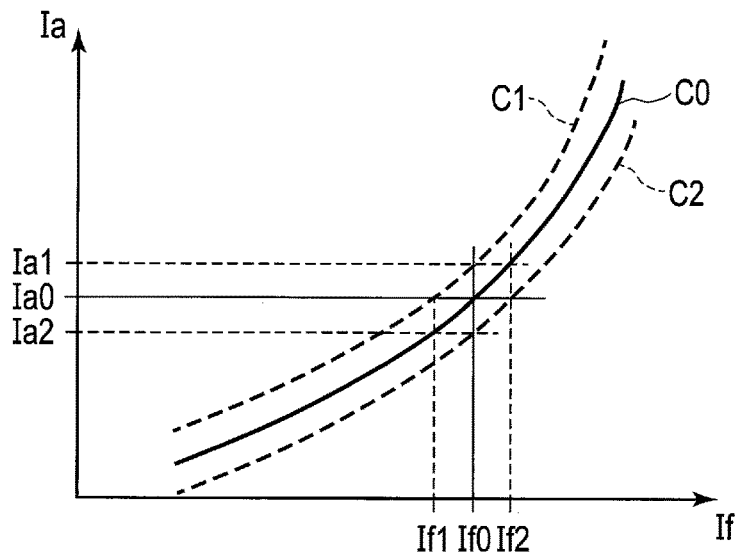
F I G. 1
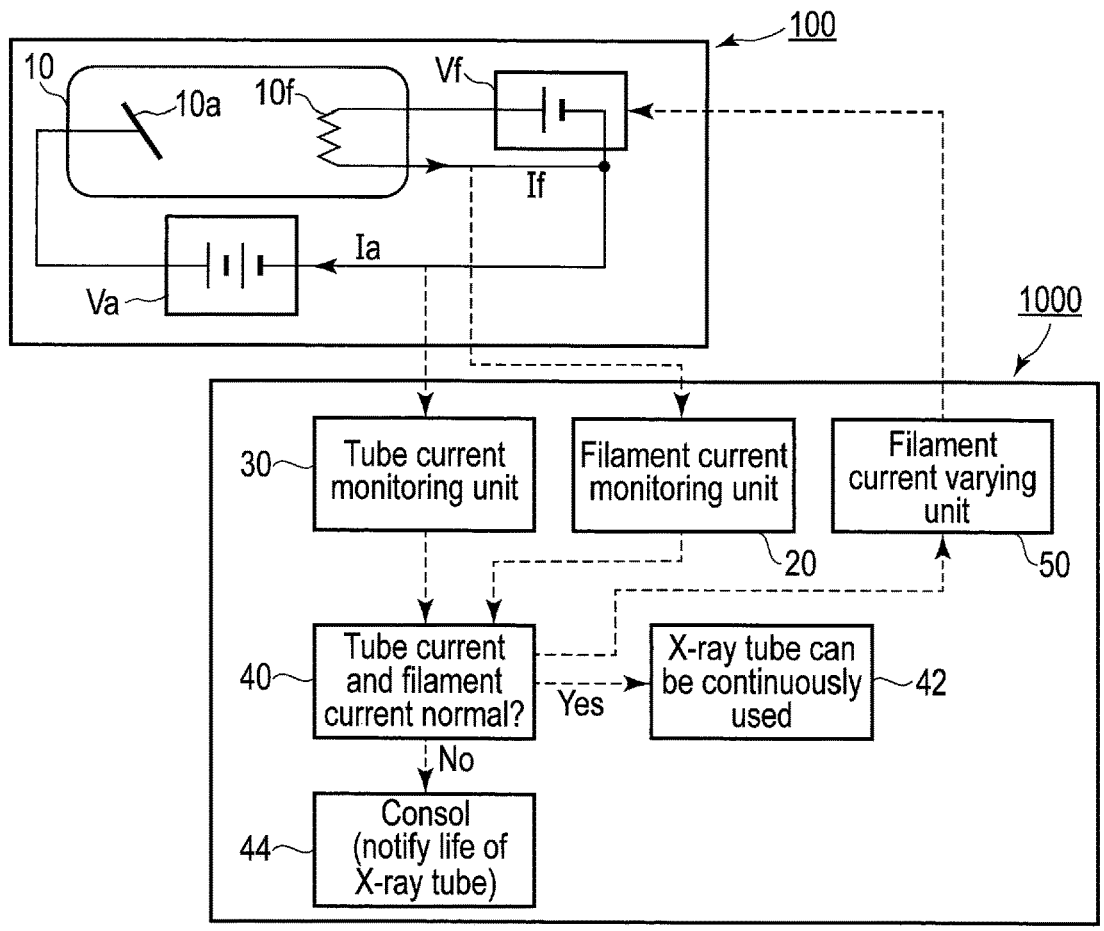
F I G. 2

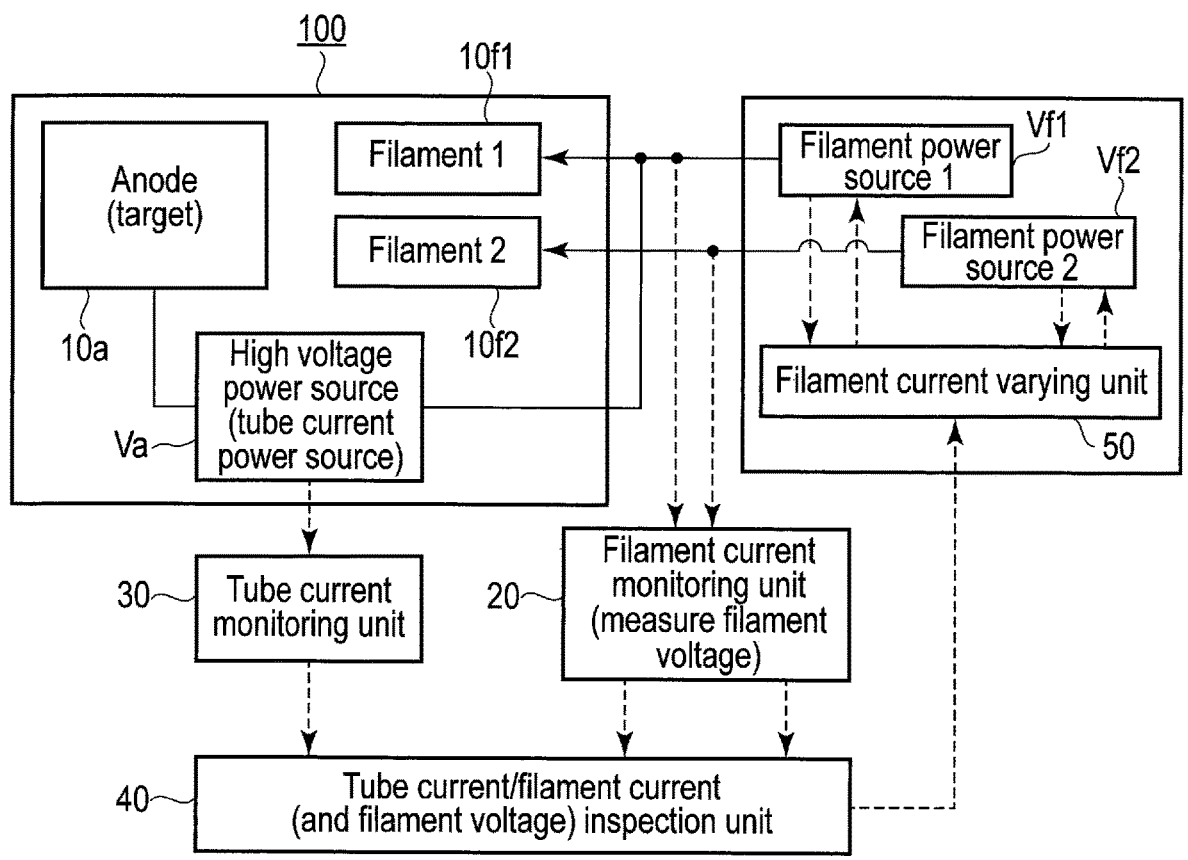
F I G. 3

X-RAY SYSTEM AND METHOD OF INSPECTING X-RAY TUBE

CROSS-REFERENCE TO RELATED APPLICATIONS

This application is based upon and claims the benefit of priority from Japanese Patent Application No. 2017-091327, filed May 1, 2017, the entire contents of which are incorporated herein by reference.

FIELD

Embodiments described herein relate generally to an X-ray system and a method of inspecting an X-ray tube employed in the X-ray system.

BACKGROUND

The X-ray system is employed for a number of purposes such as medical use (diagnosis/treatment), industrial non-destructive inspection, and material analysis. An X-ray tube used in the X-ray system is configured to make an electron beam from a cathode filament collide with an anode target and to generate X-rays.

The X-ray tube obtains thermoelectron which is an origin of a tube current, which corresponds to an electron beam colliding with a target, from heating of the filament. Heating the filament is executed by making an appropriate current flow to the filament. If a thermoelectron emission power (emission) of the filament is lowered or the degree of vacuum in a vacuum tube is lowered due to accumulation of an actual time of use of the X-ray tube, the tube current is reduced to the outside of the appropriate range and necessary X-ray output cannot be obtained.

An automatic X-ray tube calibration system for monitoring the tube current and controlling the filament current and a power consumption monitoring system for detecting X-ray irradiation abnormality have been conventionally present. However, these systems do not have a function of inspecting a relationship between the tube current and the filament current to be within an appropriate range.

BRIEF DESCRIPTION OF THE DRAWINGS

FIG. 1 is a graph for explanation of a relationship of "filament current to tube current" of an X-ray tube according to one of embodiments.

FIG. 2 is a block diagram for explanation of a configuration of essential portions of an X-ray system (using a single-filament X-ray tube) according to one of embodiments.

FIG. 3 is a block diagram for explanation of a configuration of essential portions of an X-ray system (using a double-filament X-ray tube) according to the other embodiment.

DETAILED DESCRIPTION

Figure 4:
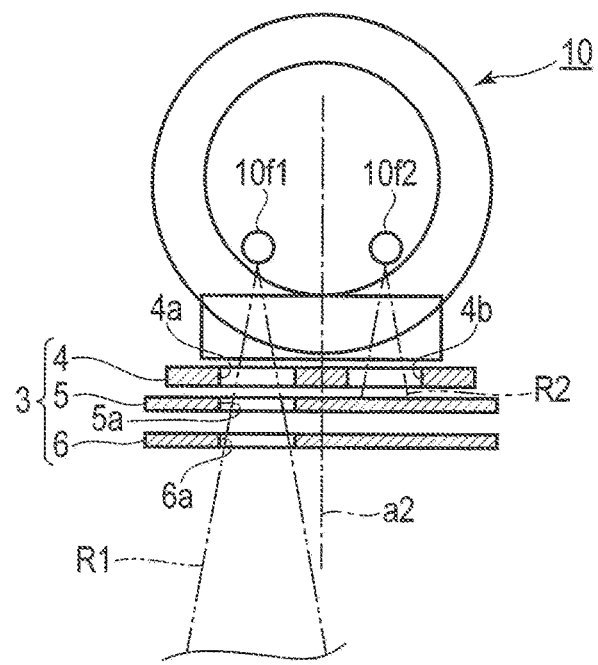
FIG. 4 is a cross-sectional view for explanation of an example of the double-filament X-ray tube available in the X-ray system shown in FIG. 3.

In general, according to one embodiment, there is provided an X-ray system, comprising: an X-ray tube comprising a filament in which a filament current according to a tube current flows; a filament current monitoring unit monitoring the filament current; a tube current monitoring unit monitoring the tube current; and an inspection unit determining whether the tube current falls within a predetermined set range in X-ray emission.

According to another embodiment, there is provided a method of inspecting an X-ray tube employable in an X-ray system, the X-ray system comprising: an X-ray tube comprising a filament in which a filament current according to a tube current flows; a filament current monitoring unit monitoring the filament current; a tube current monitoring unit monitoring the tube current; and an inspection unit determining whether the tube current falls within a predetermined set range in X-ray emission, the method comprising: determining whether the tube current obtained in response to the filament current in X-ray emission falls within the predetermined set range or not.

The above-explained X-ray system monitors the tube current (X-ray tube current) and the filament current at any time (or regularly) and determines as appropriate whether the tube current is within an appropriate range or not. The lifetime of the X-ray tube can be predicted based on the determination result.

An X-ray system and a method of inspecting an X-ray tube according to the embodiments will be described hereinafter with reference to the accompanying drawings. The numerical values mentioned below are mere examples and do not restrict the embodiments.

FIG. 1 is a graph for explanation of a relationship of "filament current If (A) to tube current Ia (mA)" of an X-ray tube according to one of embodiments. In this graph, a solid line curve C0 is indicative of a typical characteristic of the X-ray tube (a curve C0 is indicative of a feature that the tube current becomes Ia0 with rated filament current If0). An upper dashed line curve C1 is indicative of an example in which the tube current becomes large with the same filament current, within a permissible range of operation of the X-ray tube (i.e., curve C1 is indicative of a feature that the tube current becomes Ia1 larger than Ia0 with the rated filament current If0). A lower dashed line curve C2 is indicative of an example in which the tube current becomes small with the same filament current, within a permissible range of operation of the X-ray tube (i.e., curve C2 is indicative of a feature that the tube current becomes Ia2 smaller than Ia0 with the rated filament current If0). As a filament material, tungsten, thoriated tungsten, and the like can be used.

It is assumed here that normal operation of the X-ray tube is assured if the relationship between the filament current and the tube current is in an area surrounded by the upper dashed line C1 and the lower dashed line C2 in FIG. 1. In general, the graph such as FIG. 1 can be recognized from a specification (or a product catalog) of the X-ray tube.

As shown in FIG. 1, as the filament current If is made larger the tube current Ia becomes larger, at a certain tube voltage (for example, 100 kV to 150 kV between the anode and the filament). For example, it is assumed that a characteristic of the filament current to the tube current of a new X-ray tube corresponds to the curve C0 in FIG. 1 and that the tube current Ia0 is 400 mA when the filament current If0 is 4 A. In this state, if the filament current is reduced to If1 (for example, 3.9 A), the tube current is also reduced to Ia2 (for example, 360 mA). In this state, if the filament current is increased to If2 (for example, 4.1 A), the tube current is also increased to Ia1 (for example, 440 mA).

It is tentatively indicated by the above explanation that the tube current can be made to fall within a range of ±10% (±40 mA) of the rated value (400 mA) by varying the filament current within a range of ±2.5% (±0.1 A) of the rated value (4 A), and the X-ray tube can be normally operated within the range (i.e., the area surrounded by the upper dashed line C1 and the lower dashed line C2 in FIG. 1).

In contrast, if the filament is worn (evaporated) and narrowed (i.e., a diameter of the filament becomes smaller) and the degree of vacuum of the X-ray tube is lowered, in accordance with accumulation of the actual time of use of the X-ray tube, the tube current Ia is often reduced to the outside of the area surrounded by the upper dashed line C1 and the lower dashed line C2 in FIG. 1 (i.e., an area lower than the dashed line C2). This situation is a symptom indicative of a condition that the X-ray tube becomes defective but, in a short period, the tube current Ia can be returned to a value between Ia1 and Ia2 in FIG. 1 by increasing the filament current If to be larger than If2.

However, if the filament current If continues being increased to return the small tube current (smaller than Ia2) to its original magnitude (Ia0), progress of wear of the filament is accelerated and the filament is broken soon (consequently, the X-ray system becomes unavailable).

In addition, when the narrowed filament is used, the tube current often cannot be returned to its original magnitude (Ia0) even if the filament current is increased until the filament is immediately broken (and, consequently, necessary X-ray output cannot be obtained).

Alternatively, if the X-ray tube having a lowered degree of vacuum is used, tube discharge occurs and the X-ray tube often becomes unavailable.

As a result of the above explanations, if the tube current Ia becomes close to a limit on which the tube current Ia can be returned to the value between Ia1 to Ia2 in FIG. 1 by increasing the filament current If, it can be determined that the symptom that the X-ray tube becomes defective (and consequently, the X-ray system is broken) appears (or that the X-ray tube reaches the end of its life).

The determination of the symptom that the X-ray tube becomes defective (or the end of life of the X-ray tube) can be executed by monitoring the tube current and the filament current at any time (or regularly) in the state of operating the X-ray tube (at the X-ray exposure time).

FIG. 2 is a block diagram for explanation of a configuration of essential portions of an X-ray system (using a single-filament X-ray tube) according to one of embodiments. The X-ray tube assembly 100 shown in FIG. 2 comprises an X-ray tube 10, a filament power source Vf, and a high voltage source Va. A filament (cathode) 10$f$ of the X-ray tube 10 is ignited with a DC current from the filament power source Vf. A high DC voltage is applied between an anode target 10$a$ and a cathode filament 10$f$ of the X-ray tube 10, from the high voltage power source Va.

The X-ray tube 10 may be a rotation anode type X-ray tube or a stationary anode type X-ray tube. The high voltage power source Va which supplies a high voltage (for example, 100 kV to 150 kV) between the anode and the cathode of the X-ray tube is not limited to a cathode grounding type (+kV, 0V), but may be in an anode grounding type (0V, −kV) or a neutral grounding type (+kV/2, 0V, −kV/2).

The X-ray system of FIG. 2 includes a filament current controller 1000 comprising a filament current monitoring unit 20, a tube current monitoring unit 30, a tube current/filament current inspection unit 40, a filament current varying unit 50, and the like, for the X-ray tube assembly 100.

The filament current If flowing in the filament 10$f$ of the X-ray tube 10 is detected by a current probe (not shown). The detected filament current If is provided to the filament current monitoring unit 20. The filament current monitoring unit 20 can also comprise a voltmeter (not shown) which measures a terminal voltage (Vf) of the filament 10$f$, and can measure a filament voltage, simultaneously with the filament current If. DC resistance Rf(=Vf/If) of the filament 10$f$ can be thereby detected in real time.

The DC resistance Rf of the filament 10$f$ which has a high temperature (1000° C. or higher) at the ignition is increased in approximate proportion to the degree of narrowing of the filament (i.e., the degree of reduction in the diameter of the filament). For example, the DC resistance at the ignition, of the filament 10$f$ having a diameter d as a new product is assumed to be Rf (for example, 1Ω). Then, DC resistance Rf* under the same condition as the condition under which the filament 10$f$ wears and the diameter becomes d/2 becomes approximately double Rf (for example, approximately 2Ω). Therefore, if the variation in the detection value of the DC resistance Rf of the filament 10$f$ is checked at any time, the degree of wear (i.e., the degree of narrowing) of the filament 10$f$ can be monitored in real time. If the degree of wear exceeds a certain limit (or if the real-time detection value of the filament resistance Rf exceeds a specific value in a specific X-ray tube), it can be estimated that the X-ray tube reaches the end of its life soon. Data on the "degree of variation of the filament resistance Rf" which can be used to the estimation of the life of the X-ray tube can be preliminarily obtained for a plurality of samples of the X-ray tube of the same type.

The tube current Ia flowing between the anode and the cathode of the X-ray tube 10 is detected by a current probe (not shown). The detected tube current Ia is provided to the tube current monitoring unit 30. The tube current monitoring unit 30 can comprise a high-voltage voltmeter (not shown) to measure a voltage (Va) between the anode and the cathode of the X-ray tube 10. In this case, the voltage between the anode and the cathode can also be measured in real time together with the tube current Ia.

The value of the filament current If monitored by the filament current monitoring unit 20 and the value of the tube current Ia monitored by the tube current monitoring unit 30 are provided to the tube current/filament current inspection unit 40. A microcomputer (not shown) constituting the inspection unit 40 preliminarily stores information corresponding to the curves C0, C1, and C2 in FIG. 1. The stored information can be created based on data preliminarily collected on a plurality of samples of the X-ray tube of the same type as the X-ray tube to be monitored.

The tube current/filament current inspection unit 40 can comprise a function (i.e., a part of the computer program) 42 of "determining that the X-ray tube 10 can be continuously used if the relationship between the filament current If and the tube current Ia monitored in real time falls within the range between the upper dashed line curve C1 and the lower dashed line curve C2 in FIG. 1".

The tube current/filament current inspection unit 40 can comprise a function (i.e., the other part of the computer program) 44 of "determining that the X-ray tube 10 has reached the end of its life and notifying the user of the life of the vacuum tube in a console or the like if the relationship between the filament current If and the tube current Ia monitored in real time does not fall within the range between the upper dashed line curve C1 and the lower dashed line curve C2 in FIG. 1".

The tube current/filament current inspection unit 40 can also comprise a function of "sending a command to the filament current varying unit 50 such that the tube current Ia approaches a predetermined value (for example, the value of Ia0) as much as possible even if the relationship between the filament current If and the tube current Ia monitored in real time is shifted from the solid line curve C0 in FIG. 1 but falls within the range between the upper dashed line curve C1 and the lower dashed line curve C2 in FIG. 1".

More specifically, if the tube current Ia (for example, Ia=420 mA) monitored in real time is slightly larger than a predetermined value (for example, Ia0=400 mA), the filament current varying unit 50 slightly reduces the filament current If from a rated value (for example, If0=4 A) (for example, If=3.95 A) such that the tube current Ia becomes close to the predetermined value (400 mA). Oppositely, if the tube current Ia (for example, Ia=380 mA) monitored in real time is slightly smaller than a predetermined value (for example, Ia0=400 mA), the filament current varying unit 50 slightly increases the filament current If from a rated value (for example, If0=4 A) (for example, If=4.05 A) such that the tube current Ia becomes close to the predetermined value (400 mA).

If the tube current Ia (for example, Ia=320 mA) monitored in real time is remarkably smaller than a predetermined value (for example, Ia0=400 mA), the filament current varying unit 50 remarkably increases the filament current If from a rated value (for example, If0=4 A) (for example, If=4.2 A) such that the tube current Ia becomes close to the predetermined value (400 mA).

It will be considered here that, in a case where the tube current Ia (for example, Ia=340 mA) monitored in real time is smaller than a predetermined value (for example, Ia0=400 mA), the tube current Ia cannot be close to the predetermined value (400 mA) if the filament current If is not remarkably increased from a rated value (for example, If0=4 A) (for example, If=5 A or more). (It is assumed that the filament is narrowed, the electron emission power is degraded, and/or the degree of vacuum of the X-ray tube is lowered.) In this case, the "degree of variation of the filament current If" executed to obtain the predetermined tube current Ia0 is evidently large (for example. If is remarkably varied from 4 A to 5 A or more). In such a case, since the predetermined tube current Ia (for example, Ia0=400 mA) can be obtained due to increase in the filament current If, the X-ray tube 10 could not be used soon even if the X-ray tube 10 can be used in a short time. In this case, the tube current/filament current inspection unit 40 can notify the user that "the X-ray tube will reach the end of its life soon" by the function 44 in FIG. 2 while simultaneously determining that "the X-ray tube can be continuously used" by the function 42 in FIG. 2.

FIG. 3 is a block diagram for explanation of a configuration of essential portions of an X-ray system (using a double-filament X-ray tube) according to the other embodiment. In the embodiments, the X-ray tube in the X-ray tube assembly 100 comprises a plurality of (two) filaments. The high voltage power source Va and the anode target 10*a* are used for both of two filaments 10/1 and 10/2. (In the diagram of FIG. 3, the negative side of the high voltage power source Va is connected to the only filament 10/1 to indicate that a negative side circuit of the high voltage power source Va does not short-circuit current paths of the filaments 10/1 and 10/2. When the filament 10/2 is used, the negative side of the high voltage power source Va is connected to the filament 10/2 though not illustrated in the figure.)

Two filaments 10/1 and 10/2 are ignited independently of each other, by two filament power sources Vf1 and Vf2. If total filament emission of the X-ray tube (double filament) 10 shown in FIG. 3 is equal to that of the X-ray tube (single filament) 10 shown in FIG. 2, the total filament power of the filaments 10/1 and 10/2 shown in FIG. 3 becomes approximately equal to the filament power of the filament 10/ shown in FIG. 2.

Filament currents If1 and If2 flowing through the respective filaments 10/1 and 10/2 and their respective filament terminal voltages are monitored by the filament current monitoring unit 20. The tube current Ia flowing through the high voltage power source Va is monitored by the tube current monitoring unit 30.

Current/voltage monitoring results of the filaments 10/1 and 10/2 are provided in real time from the filament current monitoring unit 20 to the tube current/filament current (and filament voltage) inspection unit 40. A monitoring result of the tube current Ia is provided in real time from the tube current monitoring unit 30 to the tube current/filament current (and filament voltage) inspection unit 40.

The tube current/filament current (and filament voltage) inspection unit 40 calculates in real time DC resistances Rf1 and Rf2 of the respective filaments 10/1 and 10/2, from the voltage values/current values of the filaments 10/1 and 10/2. If the values of the resistances Rf1 and Rf2 exceed the predetermined upper limit (if, for example, the resistance values which have been 1Ω in a new product exceeds 20 due to wear of the filament), it can be estimated that the X-ray tube 10 will reach the end of its life soon.

In addition, a microcomputer (not shown) in the tube current/filament current (and filament voltage) inspection unit 40 can determine whether a relationship between the tube current Ia monitored in real time, and the filament current If1 and/or filament current If2 falls within a predetermined range such as the range between the dashed line curves C1 and C2 in FIG. 1 or not.

Whether the X-ray tube 10 can be continuously used or not can be determined based on whether the tube current Ia falls within the above predetermined range or not. In addition, even if the tube current Ia falls within the above predetermined range, the tube current/filament current (and filament voltage) inspection unit 40 can issue a command of variation of the filament current for the filament current varying unit 50 when the tube current Ia is deviated from the predetermined value (Ia0 in FIG. 1).

The filament current varying unit 50 receiving this command controls the filament power source Vf1 and/or the filament power source Vf2 such that the tube current Ia becomes close to the predetermined value (Ia0 in FIG. 1). This control can be executed in several manners. One of the manners is to simultaneously control both of the filament power sources Vf1 and Vf2 and simultaneously vary both of the currents of the filaments 10/1 and 10/2. Another manner is to control any one of the filament power sources Vf1 and Vf2 and vary the current of the filament 10/1 or 10/2. The other manner is to alternately control the filament power sources Vf1 and Vf2 and vary the current of the filament 10/1 or 10/2.

FIG. 4 is a cross-sectional view for explanation of an example of the double-filament X-ray tube available in the X-ray system shown in FIG. 3. In this example, when an electron beam (R1) of one (10/1) of two filaments 10/1 and 10/2 is used an electron beam (R2) of the other (10/2) is blocked by a shutter 3.

The shutter 3 is composed of three X-ray shielding plates (4 to 6) and an opening (X-ray transmissive window 4*a*) of one of the shielding plates (4*a*) can be held still. In contrast, positions of the other openings (X-ray transmissive windows 5*a* and 6*a*) of three X-ray shielding plates (4 to 6) can be rotationally moved around an axis a2 and, by the rotational movement of these openings, two electron beams (R1 and R2) are alternately changed at predetermined timing to be the tube current Ia. When the alternate change cycle is long, the filament current on the closed shutter side can be suppressed and the filament can hardly be worn.

Figure 5:
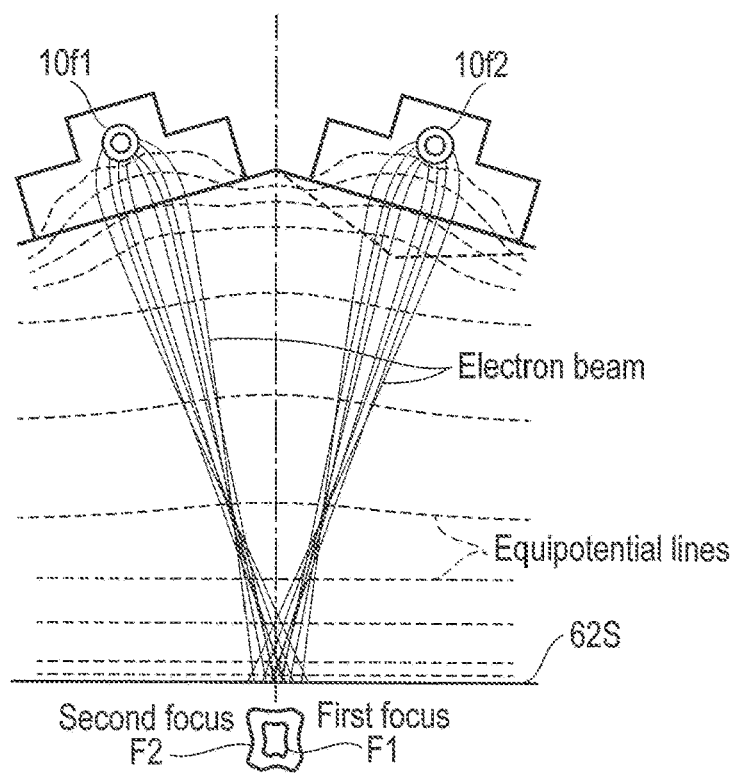
FIG. 5 is a cross-sectional view for explanation of the other example of the double-filament X-ray tube available in the X-ray system shown in FIG. 3.

FIG. 5 is a cross-sectional view for explanation of the other example of the double-filament X-ray tube available in the X-ray system shown in FIG. 3. In this example, a focus F1 formed on a target surface 62S by the electron beam from the filament 10f1 and a focus F2 formed on the target surface 62S by the electron beam from the filament 10f2 are set to overlap. Consequently, even if each filament consumes a comparatively small power, the tube current Ia similar to a current of a single filament of large emission can be made to flow totally. In the structure shown in FIG. 5, even if the large tube current Ia flows, the life of each filament can be made longer since the tube current of each of the filaments becomes smaller.

Figure 6:
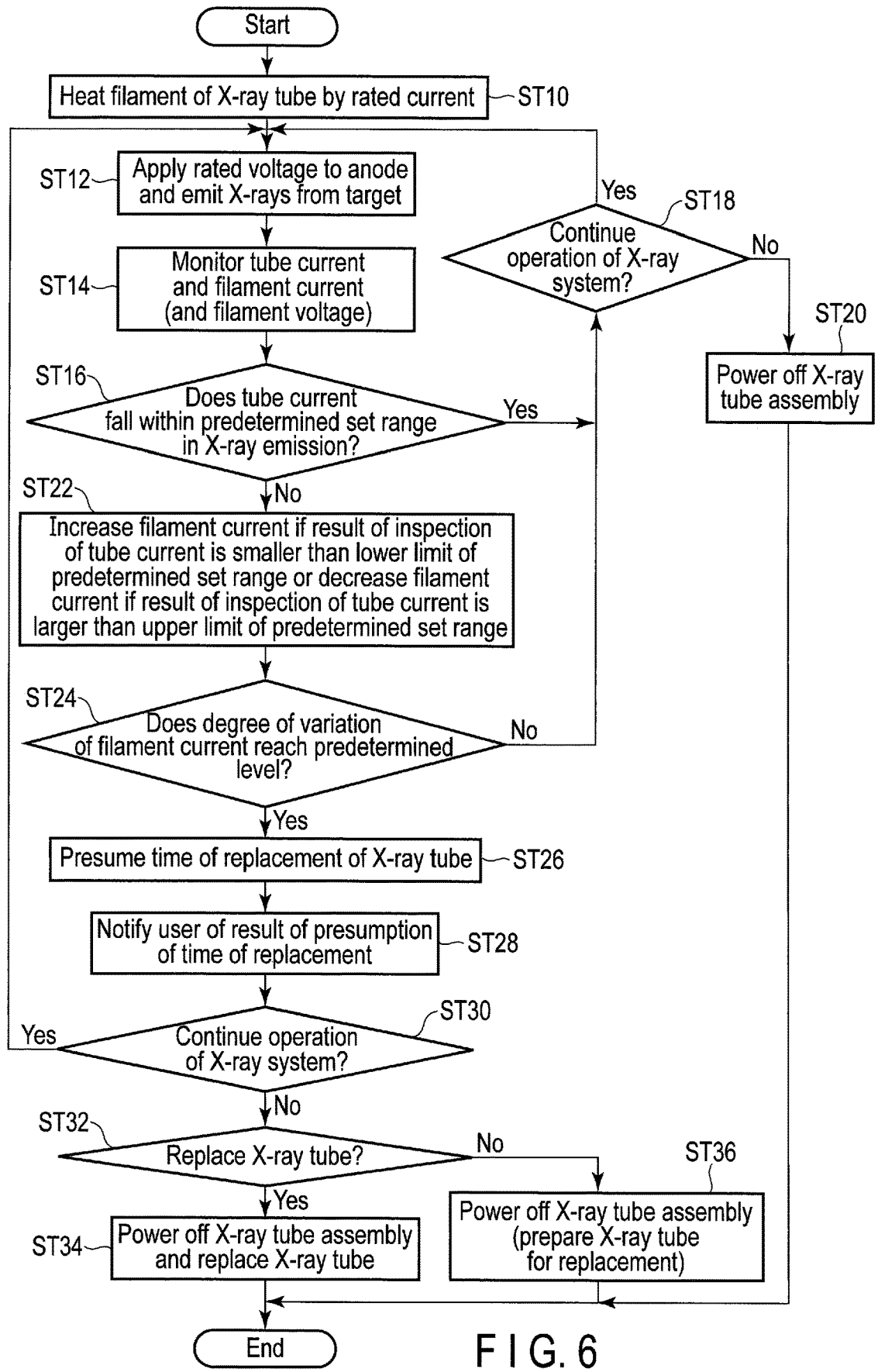
FIG. 6 is a flow chart for explanation of an operation example of the X-ray system shown in FIG. 2 or FIG. 3.

FIG. 6 is a flow chart for explanation of an operation example of the X-ray system shown in FIG. 2 (or FIG. 3). First, the filament 10f of the X-ray tube 10 is heated by a rated current (for example, 4 A) and the filament 10f is warmed up until the emission of stable thermoelectron is obtained (ST10). When the emission becomes stable, a rated voltage (for example, 100 kV) is applied to the anode and X-rays are emitted from the target 10a (ST12). When the X-ray emission starts, the tube current Ia and the filament current If (and the filament voltage Vf) are monitored at any time (or regularly at predetermined intervals) (ST14).

The tube current/filament current inspection unit 40 checks whether the value of the tube current Ia in the X-ray emission falls within a predetermined set range (i.e., the range between the upper dashed line curve C1 and the lower dashed line curve C2 in FIG. 1) or not (ST16). If the value of the tube current Ia falls within the predetermined set range (YES in ST16) and if the operation of the X-ray system continues (YES in ST18), the flow returns to ST12. If the operation of the X-ray system ends (NO in ST18), the X-ray tube assembly 100 is powered off (ST20) and the processing is ended.

If the value of the tube current Ia does not fall within a predetermined set range (NO in ST16), the filament current varying unit 50 increases or decreases the filament current If such that the value of the tube current Ia falls within a predetermined set range (for example, ±10% of the rated tube current Ia0) (ST22).

If the value of the tube current Ia falls within the predetermined set range (YES in ST16) and if the operation of the X-ray system continues (YES in ST18) as a result of making increase or decrease of the filament current If within a range reasonable for the X-ray tube 10 (for example, ±10% of the rated filament current If0), the flow returns to ST12.

If the increase or decrease of the filament current If is made within a range terrible for the X-ray tube 10, for example, if the filament current needs to be increased by 25% or more of the rated value If0 (for example, 4 A) (for example, from 4 A to 5 A or more) to return the tube current Ia to the rated value Ia0 (for example, 400 mA), it is determined that the degree of variation of the filament current If has reached a predetermined level (YES in ST24).

In this case, it is expected that the relationship between the tube current Ia and the filament current If does not fall within the predetermined set range (i.e., the range between the upper dashed line curve C1 and the lower dashed line curve C2 in FIG. 1) (NO in ST16) and that the emission of the filament 10f and/or the degree of vacuum in the vacuum tube (envelope) of the X-ray tube 10 is remarkably lowered. In this case, the time of replacement of the X-ray tube 10 is presumed based on how the filament current needs to be increased (for example, by 25% or more) to return the tube current Ia to the desired value (for example, 400 mA) (for example, if the X-ray tube 10 is continuously used, the probability of the X-ray tube 10 being defective in approximately 50 hours is 95%) (ST26). Data of plural samples preliminarily tested on the defect occurrence rate of the X-ray tube of the same type can be referred to according to this presumption.

Alternatively, if the relationship between the tube current Ia and the filament current If does not fall within the predetermined set range (i.e., the range between the upper dashed line curve C1 and the lower dashed line curve C2 in FIG. 1) (NO in ST16) and if the electric resistance Rf of the filament 10f is increased by 50 to 100% of the value of a new product, the time of replacement of the X-ray tube 10 is presumed based on the data of the plural samples preliminarily tested (for example, if the X-ray tube 10 is continuously used, the probability of the filament being broken in approximately 50 to 100 hours is 95%) (ST26).

If the time of replacement of the X-ray tube 10 is presumed, for example, the console of the X-ray system notifies the user of the presumption result of the time of replacement of the X-ray tube 10 (ST28). This notification can be made in a visual manner (blink of characters and icon of replacement request, or the like) and/or an audible manner (generation of alarm or voice guidance of the replacement request or the like).

If the operation of the X-ray system is still continued after the notification is made (YES in ST30), the flow returns to ST12. If the operation of the X-ray system is stopped when the notification is made (NO in ST30), the user determines whether the X-ray tube should be replaced or not (ST32). If a new X-ray tube 10 is stocked and the X-ray tube 10 can be replaced immediately (YES in ST32), the X-ray tube assembly 100 is powered off and the X-ray tube is replaced (ST34). If a new X-ray tube 10 is not stocked and the X-ray tube 10 cannot be replaced immediately (NO in ST32), the X-ray tube assembly 100 is powered off and an X-ray tube for replacement is prepared (ST36).

The X-ray system and the method of inspecting the X-ray tube according to the embodiments can be applied to various types of the X-ray systems. For example, the system and the method can be applied to various types of systems such as an X-ray stereo radiography system, an X-ray stereo cineradiography system, a stereo pulse fluoroscopy system and the like.

Essential Points of Embodiments

According to the X-ray system of the embodiments, the time of replacement of the X-ray tube can be understood without awaiting actual failure of the X-ray tube. A problem that the X-ray system cannot be employed until replacement of the broken X-ray tube can be thereby solved.

<Notes Corresponding to Original Claims of the Present Application>

[1] An X-ray system according to the embodiments comprises an X-ray tube comprising (at least) one filament in which a filament current (for example, 3 A to 6 A) according to a tube current (for example, 0 mA to 500 mA: varying according to the anode voltage or the degree of vacuum in the vacuum tube, but greatly depending on the filament current) flows, a filament current monitoring unit monitoring the filament current, a tube current monitoring unit monitoring the tube current (influenced by not only the emission of the filament, but also the degree of vacuum in the vacuum tube of the X-ray tube), and an inspection unit determining whether the tube current falls within a predetermined set range (for example, 400 mA±10%) in X-ray emission.

[2] The X-ray system of [1] further comprises a filament current varying unit varying the filament current (for example, varying the filament current in a range of ±50% of the rated current value 4 A), and if a result of the inspection of the tube current executed by the inspection unit falls outside the predetermined set range (for example, 400 mA±10%) (if, for example, the tube current is decreased to 340 mA by 15% or increased to 460 mA by 15%), the filament current varying unit varies the filament current (for example, varies the filament current in a range of 3 A to 6 A) such that the tube current falls within the predetermined set range.

[3] In the X-ray system of [1], the filament of the X-ray tube can comprise plural filaments (for example, two filaments). In this case, the filament current monitoring unit is composed to monitor the filament current of at least one of the plural filaments. Then, the X-ray system further comprises a filament current varying unit varying the filament current of at least one of the plural filaments.

If a result of the inspection of the tube current executed by the inspection unit falls outside the predetermined set range (for example, 400 mA±10%) (if, for example, the tube current is 340 mA), the filament current varying unit varies the filament current of the at least one of the filaments such that the tube current falls within the predetermined set range. For example, one filament current in which the emission (thermoelectron emission power) is degraded is varied in a range between 2 A and 3 A, and the other filament current in which the emission is hardly degraded remains at the rated current value of 2 A. Alternatively, for example, one filament current in which the degradation is small is considered unquestionable even if the current value is slightly varied in a range of 1.8 A to 2.2 A larger and smaller than the rated value, and the other filament current in which the degradation is relatively large is greatly varied in a range of 1.8 A to 3 A.

[4] In the X-ray system of [2] or [3], if the filament current is varied by the filament current varying unit, the time of replacement of the X-ray tube is presumed (before the filament is broken or reaches the end of its life), based on the degree of the variation (for example, the degree of deviating the range between the upper dashed line curve C1 and the lower dashed line curve C2 in FIG. 1). For example, if the filament current needs to be increased by 25% to 50% from the rated current of 4 A to a range from 5 A to 6 A in order to fall the tube current within the predetermined set range, it is estimated that the filament will be broken soon or, even if the filament is not broken the filament will reach the end of its life due to poor emission. For this presumption, for example, life test data on 100 or more of product samples having the same structure can be preliminarily collected by using the filament current as the parameter.

[5] The X-ray system of [4] further comprises a unit which, if the time of replacement of the X-ray tube is presumed, notifies the user of the result of the presumption. For example, the user can be notified that the life of the X-ray tube/the time of replacement of the X-ray tube reaches, by blink of an alarm light (or an icon for calling attention) or output of an alarm sound (or an alarm voice guidance), by the console of the X-ray system.

[6] A method of inspecting an X-ray tube according to the embodiments can be employed in an X-ray system comprising an X-ray tube comprising (at least) one filament in which a filament current according to a tube current flows, a filament current monitoring unit monitoring the filament current, a tube current monitoring unit monitoring the tube current, and an inspection unit determining whether the tube current falls within a predetermined set range in X-ray emission. In this method, it is determined whether the tube current obtained in response to the filament current (for example, 4 A) in the X-ray emission falls within a predetermined set range (for example, 400 mA±10%) or not.

[7] According to the method of [6], if the filament current is varied such that the tube current falls within the predetermined set range (for example, 400 mA±10%), the time of replacement of the X-ray tube is presumed based on the degree of the variation of the filament current. For example, if the filament current needs to be increased by 50% from the rated current of 4 A to 6 A, it can be estimated that the filament will be broken or reach the end of its life soon.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. An X-ray system comprising:
    an X-ray tube comprising a filament in which a filament current according to a tube current flows;
    a filament current monitoring unit monitoring the filament current;
    a tube current monitoring unit monitoring the tube current;
    an inspection unit determining whether the tube current falls within a predetermined set range in X-ray emission;
    a filament current varying unit varying the filament current; and
    a filament current controller,
    wherein
    the filament current controller includes the filament current monitoring unit, the tube current monitoring unit, the inspection unit, and the filament current varying unit,
    if a result of the inspection of the tube current executed by the inspection unit falls outside the predetermined set range, the filament current varying unit varies the filament current such that the tube current falls within the predetermined set range, and
    if the filament current is varied by the filament current varying unit, the time of replacement of the X-ray tube is presumed by the filament current controller based on the degree of the variation.

2. An X-ray system comprising:
    an X-ray tube comprising a filament in which a filament current according to a tube current flows;
    a filament current monitoring unit monitoring the filament current;
    a tube current monitoring unit monitoring the tube current;
    an inspection unit determining whether the tube current falls within a predetermined set range in X-ray emission; and
    a filament current controller,
    wherein the filament current controller includes the filament current monitoring unit, the tube current monitoring unit, and the inspection unit, if the filament of the X-ray tube comprises a plurality of filaments, the filament current monitoring unit is configured to monitor the filament current of at least one of the filaments, the X-ray system further comprises a filament current varying unit varying the filament current of at least one of the filaments, if a result of the inspection of the tube current executed by the inspection unit falls outside the predetermined set range, the filament current varying unit varies the filament current of at least one of the filaments such that the result of the inspection of the tube current falls within the predetermined set range, and if the filament current is varied by the filament current varying unit, the time of replacement of the X-ray tube is presumed by the filament current controller based on the degree of the variation.

3. The X-ray system of claim 2, further comprising:

a unit which, if the time of replacement of the X-ray tube is presumed by the filament current controller, notifies the user of the result of the presumption.

* * * * *